(12) United States Patent
Yen

(10) Patent No.: US 10,921,905 B2
(45) Date of Patent: Feb. 16, 2021

(54) KEYBOARD MODULE

(71) Applicants: LITE-ON ELECTRONICS (GUANGZHOU) LIMITED, Guangzhou (CN); Lite-On Technology Corporation, Taipei (TW)

(72) Inventor: Ming-Fu Yen, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 16/830,287

(22) Filed: Mar. 26, 2020

(65) Prior Publication Data

US 2020/0343058 A1 Oct. 29, 2020

Related U.S. Application Data

(60) Provisional application No. 62/838,310, filed on Apr. 25, 2019.

(30) Foreign Application Priority Data

Feb. 27, 2020 (CN) .......................... 202010124234.2

(51) Int. Cl.
*H01H 13/83* (2006.01)
*G06F 3/0354* (2013.01)
(Continued)

(52) U.S. Cl.
CPC ..... *G06F 3/03543* (2013.01); *H01H 13/7065* (2013.01); *H01H 13/83* (2013.01); *H05K 1/118* (2013.01); *H05K 1/189* (2013.01);
*H01H 2209/002* (2013.01); *H01H 2219/06* (2013.01); *H01H 2219/062* (2013.01);
(Continued)

(58) Field of Classification Search
CPC ............ H01H 13/83; H01H 2219/062; H01H 13/023; H01H 2219/036; H01H 9/182; H01H 19/025; H01H 13/14; H01H 3/125; H01H 13/7065; H01H 13/705;
(Continued)

(56) References Cited

U.S. PATENT DOCUMENTS 6,835,906 B2 * 12/2004 Okamoto ............... H01H 13/14
200/310
8,022,324 B2 * 9/2011 Liu ........................ H01H 13/88
200/314

(Continued)

*Primary Examiner* — Ahmed M Saeed
(74) *Attorney, Agent, or Firm* — JCIPRNET

(57) ABSTRACT

A keyboard module including keys, a frame, a bottom plate, and a backlight assembly is provided. The frame has a key region. Top surfaces of the keys are exposed in the key region. The frame includes a column. The bottom plate is disposed under the frame. The bottom plate includes a bending portion. The backlight assembly is disposed under the bottom plate, and sequentially includes a light shielding sheet, a light guide plate, and a reflector. The light shielding sheet has a first opening. The light guide plate has a second opening. A part of the reflector is exposed by the first opening and the second opening. The column passes through the bending portion and is located in the first opening and the second opening. A bottom surface of the column leans against the reflector.

10 Claims, 7 Drawing Sheets

(51) Int. Cl.
*H01H 13/7065* (2006.01)
*H05K 1/11* (2006.01)
*H05K 1/18* (2006.01)

(52) U.S. Cl.
CPC .............. *H01H 2219/064* (2013.01); *H05K 2201/0989* (2013.01); *H05K 2201/09236* (2013.01); *H05K 2201/09263* (2013.01); *H05K 2201/09663* (2013.01); *H05K 2201/10022* (2013.01); *H05K 2201/10106* (2013.01)

(58) Field of Classification Search
CPC .. H01H 13/70; H01H 13/7006; H01H 13/703; H01H 19/20
See application file for complete search history.

(56) References Cited

U.S. PATENT DOCUMENTS

| | | | | |
|---|---|---|---|---|
| 2006/0254894 | A1* | 11/2006 | Jung | H01H 13/83 200/314 |
| 2009/0050456 | A1* | 2/2009 | Kim | G02B 6/006 200/314 |
| 2009/0183976 | A1* | 7/2009 | Chang | H01H 13/70 200/345 |
| 2014/0055979 | A1* | 2/2014 | Suzuki | H01H 13/83 362/84 |
| 2014/0118989 | A1* | 5/2014 | Chen | H01H 13/83 362/23.03 |

* cited by examiner

KEYBOARD MODULE

CROSS-REFERENCE TO RELATED APPLICATION

This application claims the priority benefit of U.S. application Ser. No. 62/838,310, filed on Apr. 25, 2019 and China application serial no. 202010124234.2, filed on Feb. 27, 2020. The entirety of each of the above-mentioned patent applications is hereby incorporated by reference herein and made a part of this specification.

BACKGROUND

Technical Field

The invention relates to a keyboard module, and particularly relates to a keyboard module capable of preventing light leakage.

Description of Related Art

Along with development of technology, many portable electronic devices have been developed, such as notebook computers or personal digital assistants (PDAs), etc. Users may use input devices such as keyboards, mouse devices, etc., to communicate with these electronic devices. However, in a dim light environment, it may be difficult for a user to recognize numbers and letters marked on the keyboard keys, which results in a difficult operation. Therefore, a keyboard with a backlight source is introduced on the market, which applies a backlight module used in various electronic devices to a keyboard module, thereby mitigating an input problem caused by insufficient ambient light. However, due to a structural configuration of the keyboard module, light emitted by the backlight module may probably leak from an assembling gap formed by the components after assembling, which affects light output uniformity and causes trouble in use.

SUMMARY

The invention is directed to a keyboard module capable of preventing light leakage.

An embodiment of the invention provides a keyboard module including a plurality of keys, a frame, a bottom plate and a backlight assembly. The frame has a key region, and top surfaces of the keys are exposed in the key region, wherein the frame includes a column. The bottom plate is disposed under the frame, wherein the bottom plate includes a bending portion. The backlight assembly is disposed under the bottom plate, and sequentially includes a light shielding sheet, a light guide plate, and a reflector. The light shielding sheet has a first opening, and the light guide plate has a second opening. A part of the reflector is exposed by the first opening and the second opening. The column passes through the bending portion and is located in the first opening and the second opening, and a bottom surface of the column leans against the reflector.

In the keyboard module of the embodiment of the invention, the column extends toward the backlight assembly, the bending portion is bent toward the backlight assembly, and the column and the bending portion are located in the first opening and the second opening.

In the keyboard module of the embodiment of the invention, the first opening is interconnected with the second opening, and a diameter of the first opening is equal to a diameter of the second opening.

In the keyboard module of the embodiment of the invention, the light shielding sheet covers an inner wall of the second opening, and a diameter of the second opening is greater than a diameter of the first opening.

In the keyboard module of the embodiment of the invention, a length of the column is greater than a length of the bending portion.

In the keyboard module of the embodiment of the invention, a length of the bending portion is smaller than or equal to a sum of a thickness of the light shielding sheet and a thickness of the light guide plate.

In the keyboard module of the embodiment of the invention, the column includes a main body portion and an extending portion connected to the main body portion. The main body portion is located in the bending portion, and the extending portion is located between the bending portion and the reflector.

In the keyboard module of the embodiment of the invention, a gap is formed between the main body portion and the bending portion.

In the keyboard module of the embodiment of the invention, an end surface of the bending portion has a rough structure.

In the keyboard module of the embodiment of the invention, the bottom plate further includes an assembling portion, and the assembling portion is located at a periphery of the bottom plate and bent toward the frame.

Based on the above description, in the design of the keyboard module of the invention, a part of the reflector is exposed by the first opening of the light shielding sheet and the second opening of the light guide plate, and the column of the frame passes through the bending portion of the bottom plate and is located in the first opening and the second opening, and the bottom surface of the column leans against the reflector. In this way, the light emitted by the backlight assembly is shielded by the column of the frame and the bending portion of the bottom plate, so as to avoid light leakage from a gap between the bottom plate and the backlight assembly.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
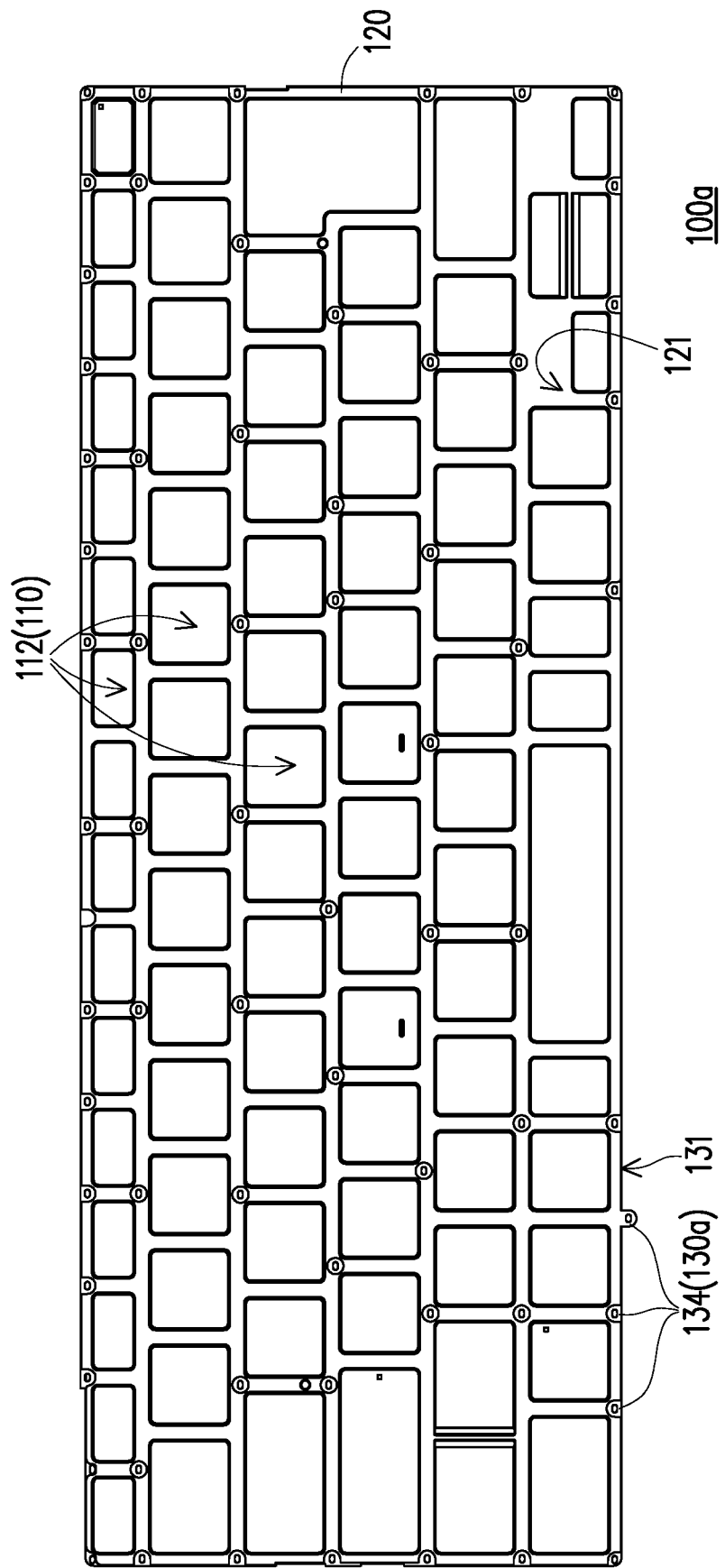
FIG. 1 is a schematic top view of a keyboard module according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
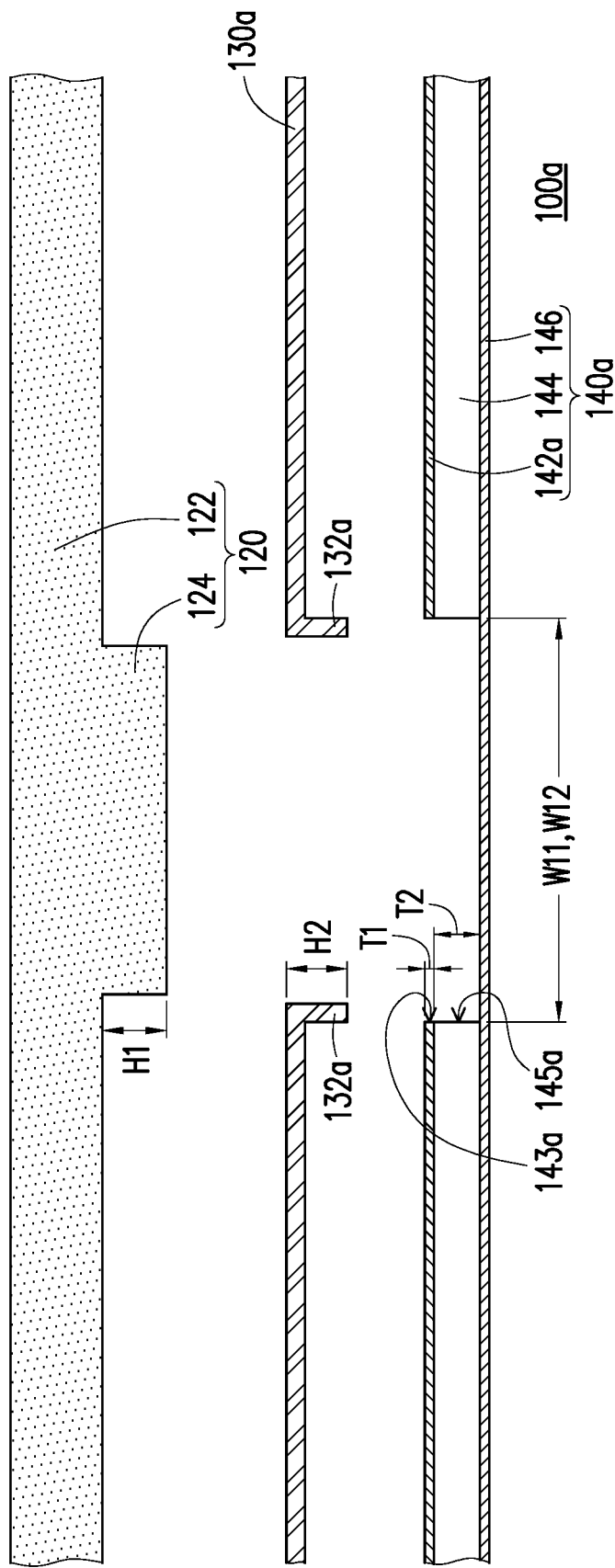
FIG. 2A is a partial cross-sectional exploded schematic view of the keyboard module of FIG. 1.
Figure 2B:
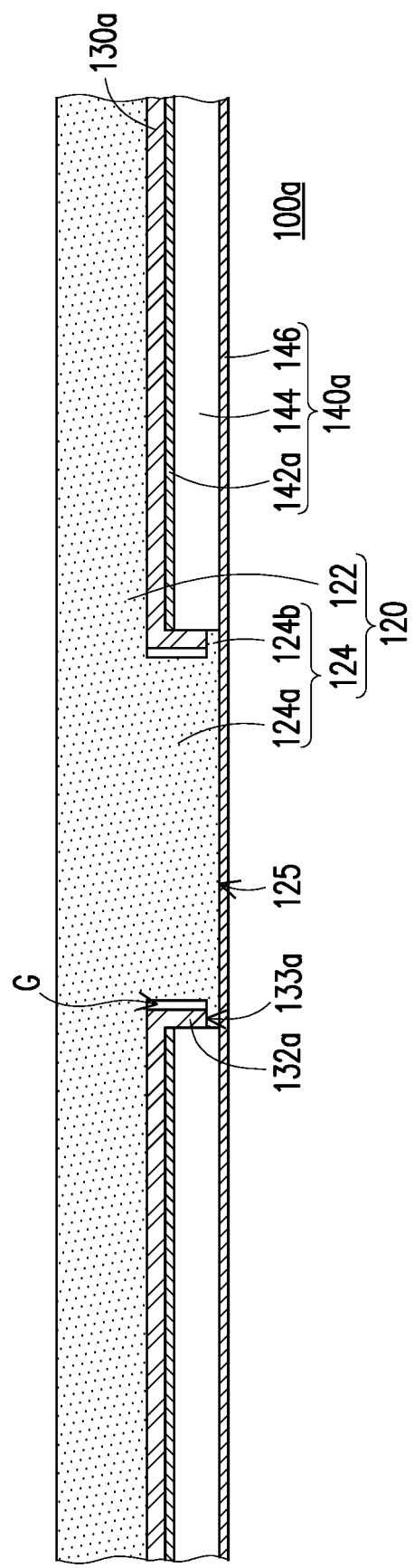
FIG. 2B is a partial cross-sectional schematic view of the keyboard module of FIG. 2A.
Figure 2C:
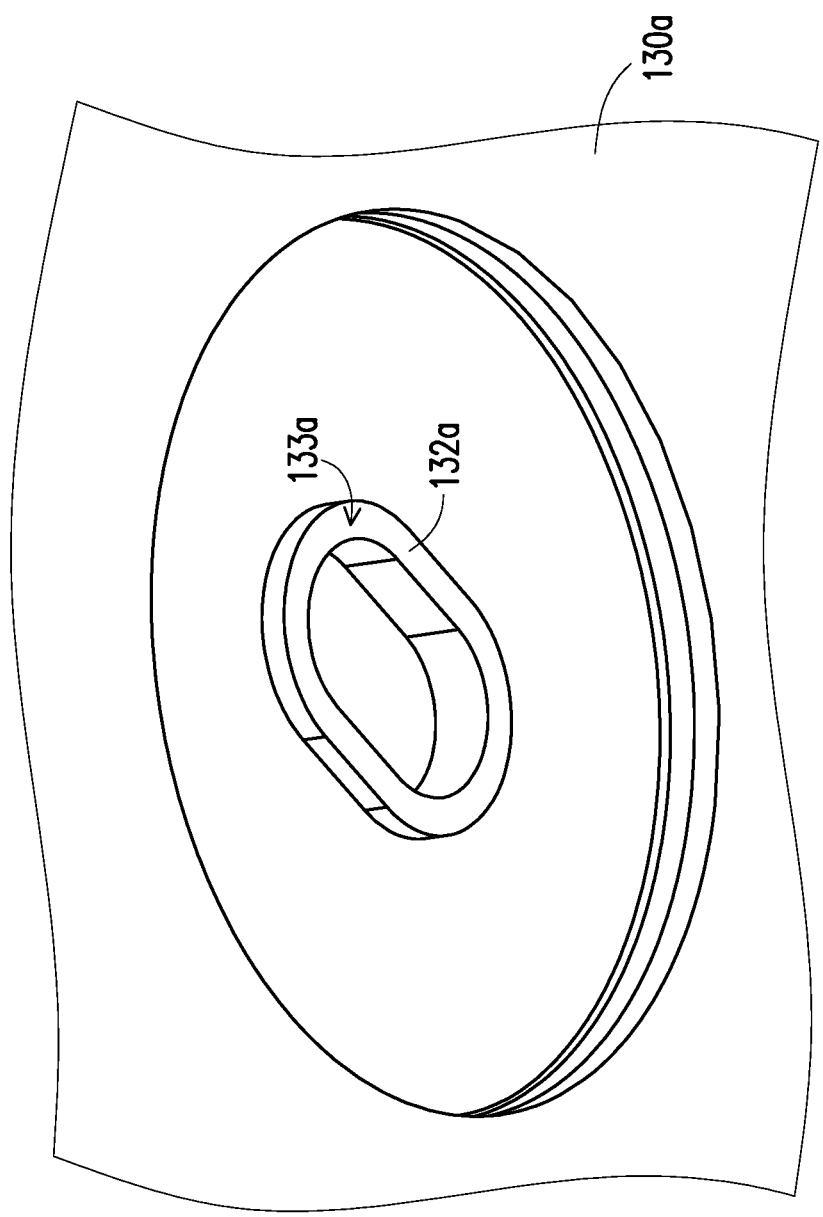
FIG. 2C is a three-dimensional schematic view of a bottom plate of the keyboard module of FIG. 2A.

FIG. 1 is a schematic top view of a keyboard module according to an embodiment of the invention. FIG. 2A is a partial cross-sectional exploded schematic view of the keyboard module of FIG. 1. FIG. 2B is a partial cross-sectional schematic view of the keyboard module of FIG. 2A. FIG. 2C is a three-dimensional schematic view of a bottom plate of the keyboard module of FIG. 2A. For simplicity's sake, unbending assembling portions are schematically illustrated in FIG. 1, and a thin film circuit board between a frame and the bottom plate is omitted in FIG. 2A and FIG. 2B.

Referring to FIG. 1, FIG. 2A and FIG. 2B first, the keyboard module 100a of the embodiment includes a plurality of keys 110, a frame 120, a bottom plate 130a and a backlight assembly 140a. The frame 120 has a key region 121, and top surfaces 112 of the keys 110 are exposed in the key region 121 of the frame 120, where the frame 120 includes a column 124 (in FIG. 2A, only one column 124 is schematically illustrated). The bottom plate 130a is disposed under the frame 120, where the bottom plate 130a includes a bending portion 132a (in FIG. 2A, only one bending portion 132a is schematically illustrated). The backlight assembly 140a is disposed under the bottom plate 130a, and sequentially includes a light shielding sheet 142a, a light guide plate 144, and a reflector 146. The light shielding sheet 142a has a first opening 143a, and the light guide plate 144 has a second opening 145a. Particularly, a part of the reflector 146 is exposed by the first opening 143a and the second opening 145a, where the column 124 passes through the bending portion 132a and is located in the first opening 143a and the second opening 145a, and a bottom surface 125 of the column 124 leans against the reflector 146. In other words, the backlight assembly 140a of the embodiment does not have a perforation structure penetrating through the light shielding sheet 142a, the light guide plate 144, and the reflector 146, i.e., the reflector 146 does not have an opening or a hole at the position correspondingly leaning against the column 124.

Further, the keyboard module 100a of the embodiment is, for example, a keyboard of a notebook computer, and the frame 120 is, for example, a frame of the keyboard, and is referred to as a C-piece in simple. The frame 120 further includes a main body 122, and the main body 122 and the column 124 are embodied as an integrally formed structure, where a material of the frame 120 is, for example, opaque plastic, and the column 124 may be regarded as a hot-melting column. An extending direction of the column 124 is substantially perpendicular to an extending direction of the main body 122, where the column 124 extends toward the backlight assembly 140a, i.e., extends downward. The bottom plate 130a is formed by stamping a metal plate, where the bending portion 132a of the bottom plate 130a is bent toward the backlight assembly 140a. Namely, the bending portion 132a of the bottom plate 130a is sprouted downward. A length H1 of the column 124 is greater than a length H2 of the bending portion 132a. In other words, the length H1 of the column 124 is longer than the length H2 of the bending portion 132a.

Moreover, the backlight assembly 140a of the embodiment is implemented by a three-layer backlight assembly, where the first opening 143a is interconnected with the second opening 145a, and a diameter W11 of the first opening 143a is equal to a diameter W12 of the second opening 145a. Namely, the light shielding sheet 142a is aligned with the light guide plate 144, and the first opening 143a and the second opening 145a expose a part of the reflector 146. Preferably, the length H2 of the bending portion 132a is less than or equal to a sum of a thickness T1 of the light shielding sheet 142a and a thickness T2 of the light guide plate 144.

Moreover, the bottom plate 130a of the embodiment further includes at least one assembling portion 134 (a plurality of assembling portions 134 are schematically illustrated in FIG. 1), where the assembling portions 134 are located at a periphery 131 of the bottom plate 130a and bent toward the frame 120, so as to engage the bottom plate 130a on the frame 120. Namely, the bottom plate 130a may be assembled with the frame 120 through the assembling portions 134.

Referring to FIG. 2A and FIG. 2B, during assembling, the column 124 of the frame 120 may be first operated to pass through the bending portion 132a of the bottom plate 130a, and a hot-melting process is performed to bond the hot-melted column 124 with an end surface 133a of the bending portion 132a. As shown in FIG. 2C, the end surface 133a of the bending portion 132a of the embodiment is embodied as a plane, but the invention is not limited thereto. In this case, the column 124 includes a main body portion 124a (only one main body portion 124a is schematically illustrated in FIG. 2B) and an extending portion 124b (only one extending portion 124b is schematically illustrated in FIG. 2B) connected to the main body portion 124a. Then, the backlight assembly 140a is assembled to the bottom plate 130a from bottom to top, so that the main body portion 124a of the column 124 and the bending portion 132a are located in the first opening 143a and the second opening 145a, and the extending portion 124b of the column 124 is located between the bending portion 132a and the reflector 146 of the backlight assembly 140a. In this case, a gap G is formed between the main body portion 124a and the bending portion 132a.

Since the column 124 of the frame 120 of the embodiment passes through the bending portion 132a of the bottom plate 130a and is located in the first opening 143a and the second opening 145a of the backlight assembly 140a, and the bottom surface 125 of the column 124 leans against the reflector 146, the light emitted by the backlight assembly 140a may be blocked by the extending portion 124b of the column 124 and the bending portion 132a of the bottom plate 130a, so as to avoid light leakage from the gap between the bottom plate 130a and the backlight assembly 140a. In addition, since the reflector 146 of the embodiment does not have an opening or a hole at the position correspondingly leaning against the column 124, the problem of light leakage is avoided.

It should be noted that in the aforementioned embodiment, the bending portion 132a of the bottom plate 130a is bent toward the backlight assembly 140a, i.e., sprouted downward, but the invention is not limited thereto. In other embodiments that are not illustrated, the bending portion of the bottom plate may also be bent toward the frame, i.e., the bending portion of the bottom plate may be sprouted upward, and the column passes through the bending portion and is located in the first opening of the light shielding sheet and the second opening of the light guide plate, which is still considered to be within a protection scope of the invention.

It should be noted that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 3:
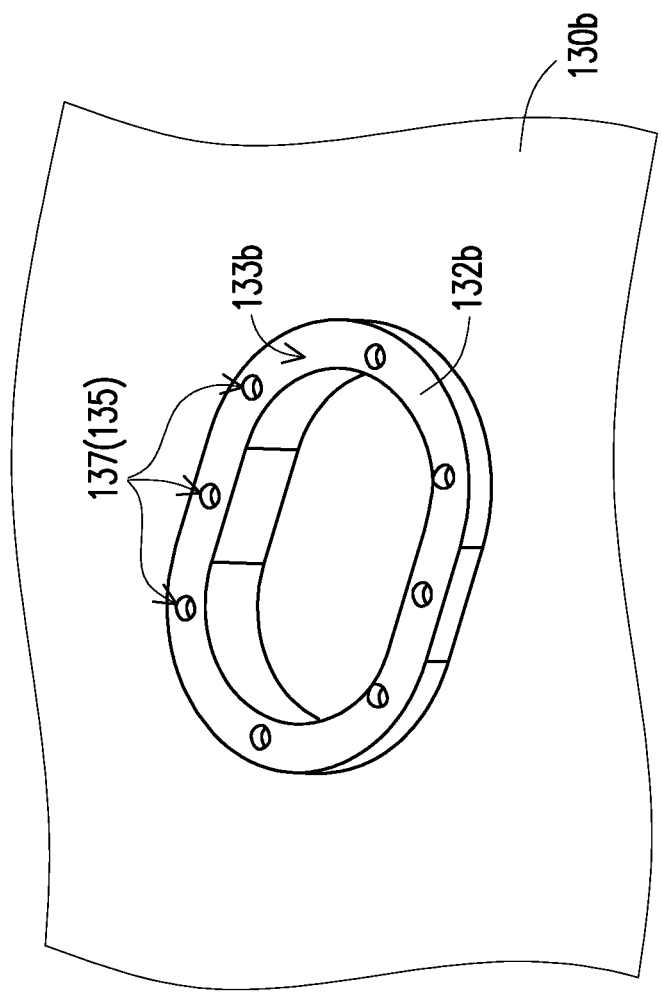
FIG. 3 is a three-dimensional schematic view of a bottom plate according to another embodiment of the invention.

FIG. 3 is a three-dimensional schematic view of a bottom plate according to another embodiment of the invention. Referring to FIG. 2C and FIG. 3, the bottom plate 130b of the embodiment is similar to the bottom plate 130a of FIG. 2C, and a difference there between is that the end surface 133b of the bending portion 132b of the bottom plate 130b of the embodiment has a rough structure 135, where the rough structure 135 may be, for example, a concave-convex structure composed of a plurality of holes 137, but the invention is not limited thereto. In other embodiments that are not illustrated, the rough structure may also be, for example, microstructures composed of serrated, quasi-serrated or irregular patterns, which is still considered to be within the protection scope of the invention.

Since the end surface 133b of the bending portion 132b of the embodiment has the rough structure 135, a contact area between the bending portion 132b and the extending portion 124b of the column 124 may be increased, so as to increase bonding strength between the bending portion 132b of the bottom plate 130b and the column 124 of the frame 120.

Figure 4:
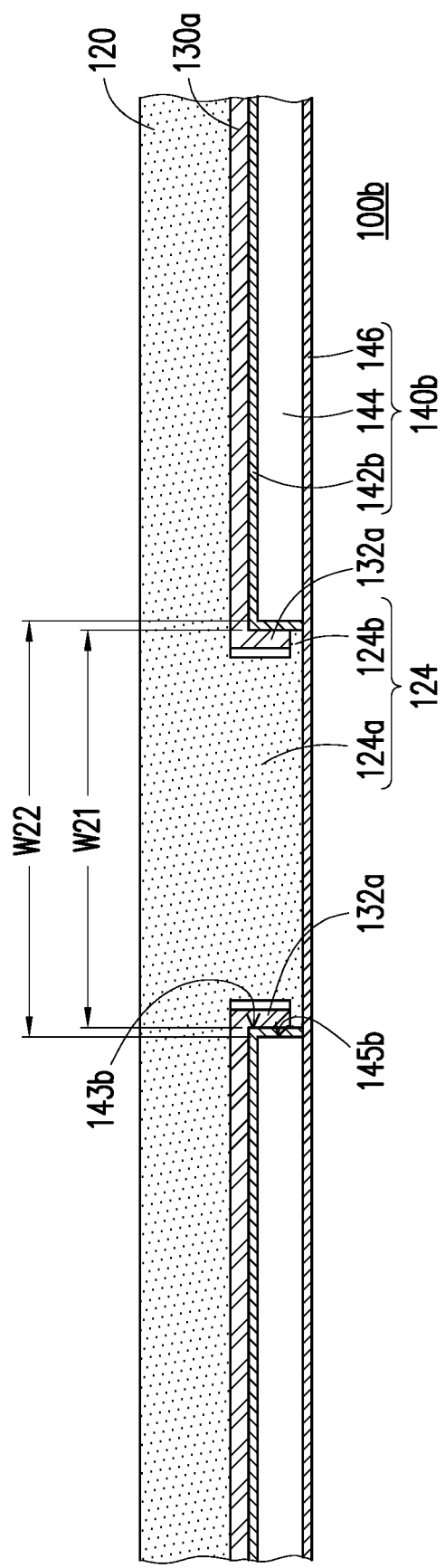
FIG. 4 is a partial cross-sectional schematic view of a keyboard module according to another embodiment of the invention.

FIG. 4 is a partial cross-sectional schematic view of a keyboard module according to another embodiment of the invention. Referring to FIG. 2B and FIG. 4, the keyboard module 100b of the embodiment is similar to the keyboard module 100a of FIG. 2B, and a difference there between is that the light shielding sheet 142b of the backlight assembly 140b of the embodiment covers an inner wall of the second opening 145b, and a diameter W22 of the second opening 145b is larger than a diameter W21 of the first opening 143b. Namely, the light shielding sheet 142b of the embodiment shields the second opening 145b of the light guide plate 144, and the light emitted by the backlight assembly 140b may be blocked by the light shielding sheet 142b, the extending portion 124b of the column 124, and the bending portion 132a of the bottom plate 130a, so as to avoid light leakage from the gap between the bottom plate 130a and the backlight assembly 140b, which may have a better light shielding effect.

Figure 5:
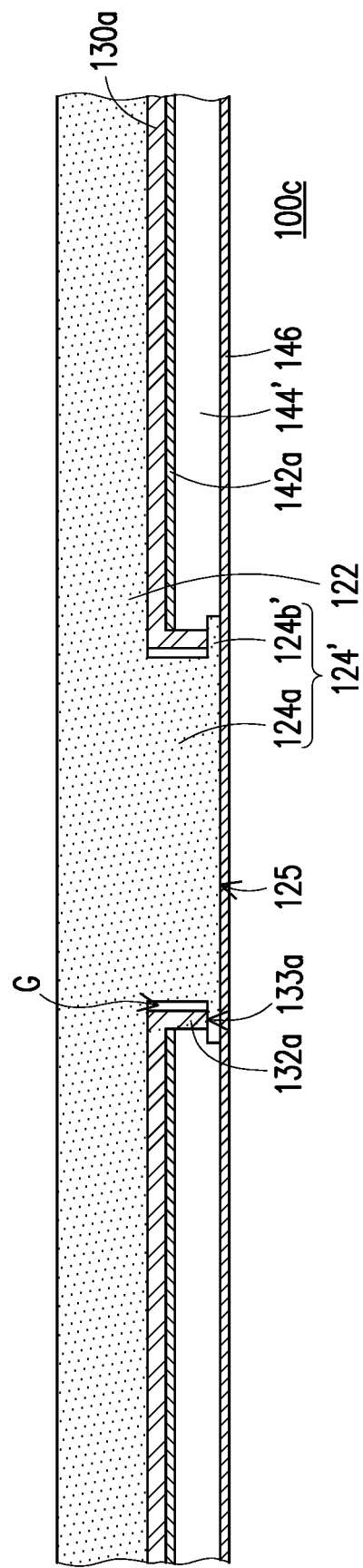
FIG. 5 is a partial cross-sectional schematic view of a keyboard module according to still another embodiment of the invention.

FIG. 5 is a partial cross-sectional schematic view of a keyboard module according to still another embodiment of the invention. Referring to FIG. 2B and FIG. 5, the keyboard module 100c of the embodiment is similar to the keyboard module 100a of FIG. 2B, and a difference there between is that the extending portion 124b' of the column 124' of the embodiment extends toward the light guide plate 144' and is located between the light guide plate 144' and the reflector 146. Namely, in addition to being located between the bending portion 132a and the reflector 146, the extending portion 124b' of the embodiment further extends beyond the bending portion 132a and is located between the light guide plate 144' and the reflector 146.

In summary, in the design of the keyboard module of the invention, the backlight assembly has an opening exposing a part of the reflector, and the column of the frame passes through the bending portion of the bottom plate and is located in the opening, and the bottom surface of the column leans against the reflector. In this way, the light emitted by the backlight assembly may be shielded by the column and the bending portion, so as to avoid light leakage from a gap between the bottom plate and the backlight assembly. Moreover, the backlight assembly of the embodiment does not have a perforation structure, so that no light may be seen from the back of the keyboard module, so as to achieve the light shielding effect.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A keyboard module, comprising:
a plurality of keys;
a frame, having a key region, and top surfaces of the keys being exposed in the key region, wherein the frame comprises a column;
a bottom plate, disposed under the frame, wherein the bottom plate comprises a bending portion; and
a backlight assembly, disposed under the bottom plate and sequentially comprising a light shielding sheet, a light guide plate, and a reflector, wherein the light shielding sheet has a first opening, the light guide plate has a second opening, and a part of the reflector is exposed by the first opening and the second opening, wherein the column passes through the bending portion and is located in the first opening and the second opening, and a bottom surface of the column leans against the reflector.

2. The keyboard module according to claim 1, wherein the column extends toward the backlight assembly, the bending portion is bent toward the backlight assembly, and the column and the bending portion are located in the first opening and the second opening.

3. The keyboard module according to claim 1, wherein the first opening is interconnected with the second opening, and a diameter of the first opening is equal to a diameter of the second opening.

4. The keyboard module according to claim 1, wherein the light shielding sheet covers an inner wall of the second opening, and a diameter of the second opening is greater than a diameter of the first opening.

5. The keyboard module according to claim 1, wherein a length of the column is greater than a length of the bending portion.

6. The keyboard module according to claim 1, wherein a length of the bending portion is smaller than or equal to a sum of a thickness of the light shielding sheet and a thickness of the light guide plate.

7. The keyboard module according to claim 1, wherein the column comprises a main body portion and an extending portion connected to the main body portion, the main body portion is located in the bending portion, and the extending portion is located between the bending portion and the reflector.

8. The keyboard module according to claim 7, wherein a gap is formed between the main body portion and the bending portion.

9. The keyboard module according to claim 1, wherein an end surface of the bending portion has a rough structure.

10. The keyboard module according to claim 1, wherein the bottom plate further comprises an assembling portion, and the assembling portion is located at a periphery of the bottom plate and is bent toward the frame.

* * * * *